United States Patent
Imai et al.

(10) Patent No.: US 8,164,331 B2
(45) Date of Patent: Apr. 24, 2012

(54) MAGNETIC FIELD MEASUREMENT METHOD AND MAGNETIC SENSOR

(75) Inventors: Takakazu Imai, Tokyo (JP); Junya Fukuda, Tokyo (JP); Kei Tanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 147 days.

(21) Appl. No.: 12/411,842

(22) Filed: Mar. 26, 2009

(65) Prior Publication Data

US 2009/0243608 A1  Oct. 1, 2009

(30) Foreign Application Priority Data

Mar. 28, 2008  (JP) .................. P2008-087011

(51) Int. Cl.
*G01R 33/02*  (2006.01)

(52) U.S. Cl. .................................................. 324/252

(58) Field of Classification Search ............. 324/207.22, 324/252
See application file for complete search history.

(56) References Cited

U.S. PATENT DOCUMENTS

| | | | |
|---|---|---|---|
| 4,012,781 A * | 3/1977 | Lin ................................ | 360/315 |
| 4,596,950 A | 6/1986 | Lienhard et al. | |
| 5,126,668 A * | 6/1992 | Nojima et al. ................. | 324/248 |
| 5,831,426 A | 11/1998 | Black, Jr. et al. | |
| 6,252,390 B1 | 6/2001 | Black, Jr. et al. | |
| 7,615,996 B1 * | 11/2009 | Machita et al. ................ | 324/252 |
| 2002/0164828 A1 * | 11/2002 | Ishiwata et al. ................ | 438/3 |
| 2004/0087037 A1 * | 5/2004 | Berg et al. ..................... | 438/3 |
| 2007/0121249 A1 * | 5/2007 | Parker ............................ | 360/126 |
| 2007/0139826 A1 * | 6/2007 | Carey et al. .................... | 360/319 |
| 2007/0153432 A1 * | 7/2007 | Sbiaa et al. ................ | 360/324.11 |
| 2007/0253120 A1 * | 11/2007 | Saito et al. ................ | 360/324.11 |
| 2008/0054897 A1 * | 3/2008 | Crolly et al. .................. | 324/252 |

FOREIGN PATENT DOCUMENTS

JP  A-2006-019383  1/2006

OTHER PUBLICATIONS

General: Magnetoresistive sensors for magnetic field measurement, Phillips Semiconductors, Phillips, Sep. 6, 2000.*

* cited by examiner

*Primary Examiner* — Jay Patidar
(74) *Attorney, Agent, or Firm* — Oliff & Berridge, PLC

(57) ABSTRACT

The magnetic field measurement method has: a step of preparing a magnetic sensor which includes: a magneto-resistive effect element having a magnetization-free layer and a magnetization fixed layer, and having a longitudinal direction; and magnetic field application means, wherein the magnetization direction of the magnetization fixed layer is fixed in a direction which forms an angle equal to or less than 45 degrees to the longitudinal direction, and a magnetic field generated by the magnetic field application means forms an angle equal to or less than 45 degrees to the longitudinal direction; a step of saturating the magnetization of the magnetization-free layer by the magnetic field application means and magnetizing the magnetization-free layer in one direction in the longitudinal direction; and a step of measuring the strength of an external magnetic field by applying the external magnetic field to the magnetization-free layer in the other direction in the longitudinal direction.

8 Claims, 11 Drawing Sheets

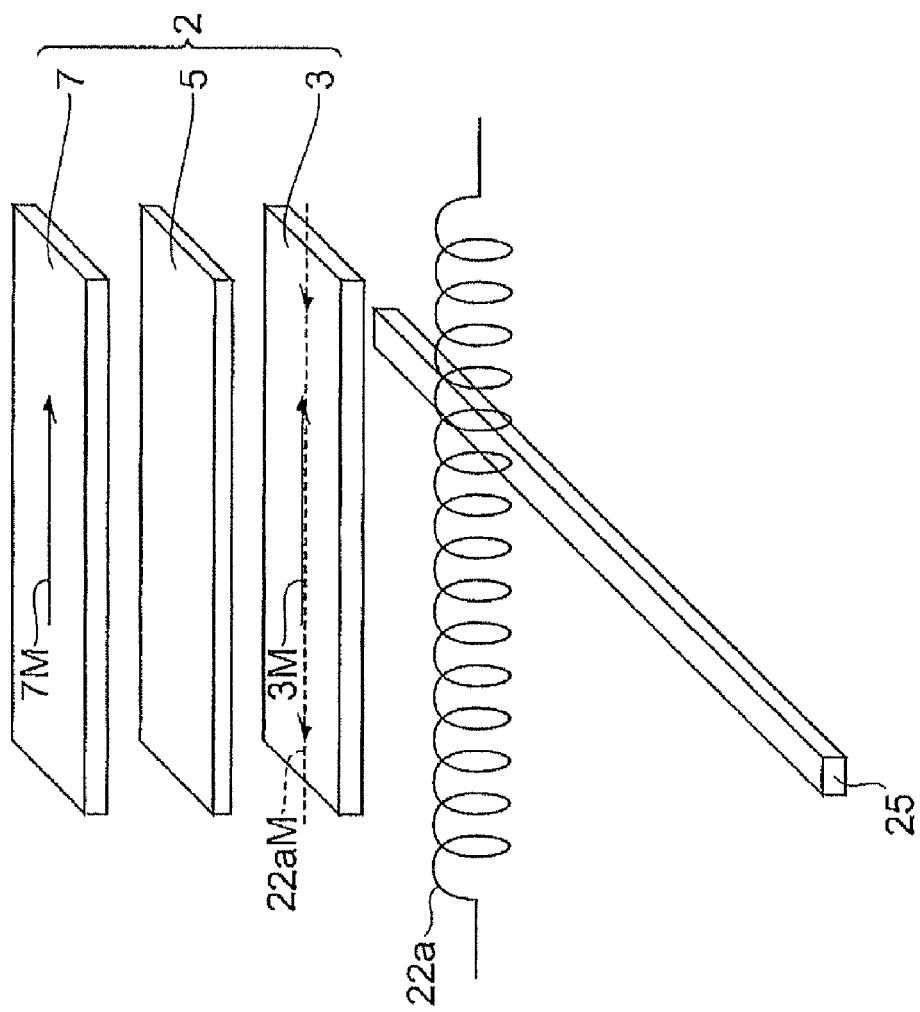

MAGNETIC FIELD MEASUREMENT METHOD AND MAGNETIC SENSOR

BACKGROUND OF THE INVENTION

1. Field of the Invention

The present invention relates to a magnetic field measurement method and a magnetic sensor.

2. Related Background Art

Magnetic sensors which employ a magneto-resistive effect element such as a GMR (Giant Magneto-Resistive) element are known. These magnetic sensors utilize a phenomenon whereby the resistance value of the magneto-resistive effect element depends on the relative angle between the magnetization orientations of a magnetization-free layer and a magnetization fixed layer respectively in the magneto-resistive effect element. More specifically, while a fixed sensing current is flowing in the magneto-resistive effect element, an external magnetic field which is to be measured is applied to the magnetization-free layer in the magnetic sensor in order to change the magnetization direction thereof and measurement of the external magnetic field is performed by measuring the resistance value of the magneto-resistive effect element.

In cases where an external magnetic field is applied to the magnetization-free layer, hysteresis exists for the relationship between the degree of magnetization of the magnetization free layer and the external magnetic field (called 'hysteresis of the magnetization free layer' hereinbelow). Hence, hysteresis also exists for the relationship between the resistance value of the magneto-resistive effective element and the external magnetic field (called 'hysteresis of the element resistance' hereinbelow). That is, even when an external magnetic field of the same strength is applied, the resistance value and the gain of the magneto-resistive effect element (the gradient of the graph of the external magnetic field/the resistance value of the magneto-resistive effect element) sometimes change depending on the strength of another external magnetic field applied to the magnetization-free layer just before the external magnetic field is applied. When this arises, an error is generated upon measuring the external magnetic field using the magnetic sensor.

In order to reduce such errors, in a conventional magnetic sensor, the magnetization direction of the magnetization fixed layer is fixed in a direction perpendicular to the longitudinal direction of the magnetization fixed layer (see Japanese Patent Application Laid-open No. 2006-19383, for example). The hysteresis of the magnetization fixed layer is accordingly small and therefore errors when measuring an external magnetic field are reduced.

SUMMARY OF THE INVENTION

However, there is the problem that, because the hysteresis of the magnetization free layer in the conventional magnetic sensor above is small, the gain when measuring the external magnetic field will be small. When the hysteresis of the magnetization fixed layer is made large in order to produce a large gain, there are frequent errors when measuring the external magnetic field.

The present invention was conceived in view of such problems and an object of the present invention is to provide a magnetic field measurement method and a magnetic sensor which enable a large gain and allow measurement errors to be reduced when measuring an external magnetic field.

In order to resolve the above problems, the magnetic field measurement method of the present invention comprises: a step of preparing a magnetic sensor comprising: a magneto-resistive effect element which has a stacked body obtained by stacking a magnetization-free layer, a nonmagnetic layer and a magnetization fixed layer so that the nonmagnetic layer is positioned between the magnetization-free layer and the magnetization fixed layer, and the longitudinal direction of which is one direction perpendicular to the stacking direction; and magnetic field application means for generating a magnetic field by being supplied with a current, wherein the magnetization direction of the magnetization fixed layer is fixed in a direction which forms an angle equal to or less than 45 degrees to the longitudinal direction of the magnetization free layer when viewed from the stacking direction, and the magnetic field generated by the magnetic field application means forms within the magnetization-free layer an angle equal to or less than 45 degrees to the longitudinal direction of the magnetization free layer when viewed from the stacking direction; a magnetic field application step of applying a magnetic field for a predetermined time to the magnetization-free layer by the magnetic field application means so that the magnetization of the magnetization-free layer is saturated, and magnetizing the magnetization-free layer in one direction in the longitudinal direction thereof; and a magnetic field measurement step of measuring the strength of an external magnetic field which is to be measured by applying the external magnetic field to the magnetization-free layer in the other direction in the longitudinal direction thereof, after the magnetic field application step.

According to the magnetic field measurement method of the present invention, the magnetization direction of the magnetization fixed layer is fixed in a direction which forms an angle equal to or less than 45 degrees to the longitudinal direction of the magnetization free layer when viewed from the stacking direction and the hysteresis of the magnetization free layer is therefore large and a large gain when measuring the external magnetic field can accordingly be enabled.

In addition, because the magnetization of the magnetization-free layer is saturated in one direction in the longitudinal direction of the magnetization-free layer in the magnetic field application step, the magnetized state of the magnetization-free layer in the magnetic field measurement step is fixed irrespective of the magnetized state of the magnetization-free layer prior to the magnetic field application step. Furthermore, because an external magnetic field which is to be measured is applied in the reverse direction from the direction in which the magnetization of the magnetization-free layer is saturated, the external magnetic field can be measured by utilizing a region of high linearity in the relationship of the resistance value of the magneto-resistive effect element with the external magnetic field. Errors when measuring the external magnetic field can thus be reduced.

In addition, the magnetic field application means is preferably a current path portion which extends in a direction which forms an angle equal to or less than 45 degrees to a direction perpendicular to the longitudinal direction of the magnetization free layer when viewed from the stacking direction. The structure of the magnetic field application means thus becomes accordingly simple.

Moreover, the magnetic field generated by the magnetic field application means is preferably oriented within the magnetization-free layer in the longitudinal direction of the magnetization-free layer when viewed from the stacking direction. The magnetization of the magnetization-free layer can thus be easily saturated by the magnetic field application means.

Furthermore, the magnetization direction of the magnetization-free layer is preferably fixed in the longitudinal direction of the magnetization-free layer when viewed from the stacking direction. The hysteresis of the magnetization-free layer is then accordingly particularly large. As a result, the gain when measuring the external magnetic field can be made particularly large.

In addition, in the magnetic field measurement step, the external magnetic field which is to be measured is preferably applied to the magnetization-free layer in the other direction in the longitudinal direction thereof by the magnetic field application means while applying a bias magnetic field of a predetermined strength to the magnetization-free layer in the other direction in the longitudinal direction thereof. The external magnetic field can thus be measured by utilizing a region of high linearity in particular in the relationship of the resistance value of the magneto-resistive effect element with the external magnetic field. As a result, errors when measuring the external magnetic field can be further reduced.

The magnetic sensor according to the present invention comprises a magneto-resistive effect element which has a stacked body obtained by stacking a magnetization-free layer, a nonmagnetic layer and a magnetization fixed layer so that the nonmagnetic layer is positioned between the magnetization-free layer and the magnetization fixed layer, and the longitudinal direction of which is one direction perpendicular to the stacking direction; and magnetic field application means for generating a magnetic field by being supplied with a current, wherein the magnetization direction of the magnetization fixed layer is fixed in a direction which forms an angle equal to or less than 45 degrees to the longitudinal direction of the magnetization free layer when viewed from the stacking direction and the magnetic field generated by the magnetic field application means forms within the magnetization-free layer an angle equal to or less than 45 degrees to the longitudinal direction of the magnetization free layer when viewed from the stacking direction.

With the magnetic sensor according to the present invention, the magnetization direction of the magnetization-free layer is fixed in a direction which forms an angle equal to or less than 45 degrees to the longitudinal direction of the magnetization free layer when viewed from the stacking direction and the hysteresis of the magnetization-free layer is therefore large. A large gain when measuring the external magnetic field can accordingly be enabled.

In addition, if the magnetization of the magnetization-free layer is saturated in one direction in the longitudinal direction of the magnetization-free layer by the magnetic field application means prior to the magnetic field measurement step, the magnetized state of the magnetization-free layer when measuring the external magnetic field is fixed irrespective of the magnetized state of the magnetization-free layer prior to saturating the magnetization of the magnetization-free layer. Furthermore, if the external magnetic field which is to be measured is applied in the reverse direction from the direction in which the magnetization of the magnetization-free layer is saturated, the external magnetic field can be measured by utilizing a region of high linearity in the relationship of the resistance value of the magneto-resistive effect element with the external magnetic field. Errors when measuring the external magnetic field can thus be reduced.

The present invention provides a magnetic field measurement method and a magnetic sensor which enable a large gain and allow measurement errors to be reduced when measuring an external magnetic field.

BRIEF DESCRIPTION OF THE DRAWINGS

FIG. 11 is a schematic view of the positional relationships between the stacked body and the current path portion which the magneto-resistive effect element comprises.

DESCRIPTION OF THE PREFERRED EMBODIMENTS

Figure 1:
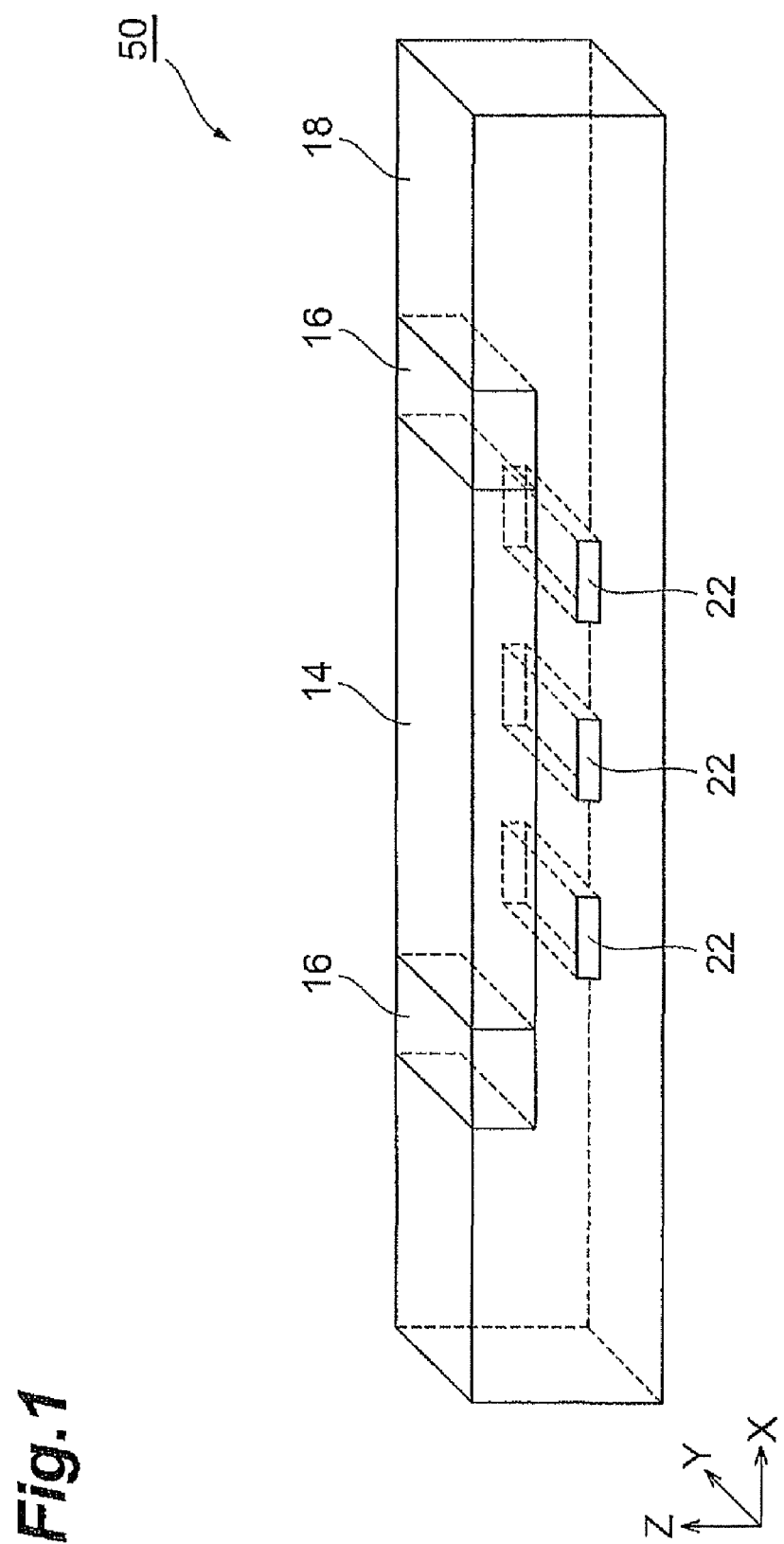
FIG. 1 is a view showing a schematic overview of a magnetic sensor of this embodiment.

A magnetic sensor according to an embodiment and a method of measuring magnetic field strength which uses such a magnetic sensor will be described in detail hereinbelow with reference to the attached drawings. The same reference numerals are used for the same elements where possible in each of the drawings. Furthermore, the dimensional ratios within and between the constituent elements in the drawings are arbitrary, having been selected to make the drawings clear.

FIG. 1 is a view showing a schematic structure of a magnetic sensor of this embodiment. As shown in FIG. 1, a magnetic sensor 50 comprises a magneto-resistive effect element 14, a current path portion 22 as magnetic field application means, a pair of electrode layers 16, and an insulation layer 18.

The magneto-resistive effect element 14 comprising a plurality of layers which are stacked in a direction along the Z axis (that is, the stacking direction of the magneto-resistive effect element 14 is a direction moving in a positive direction along the Z axis or a negative direction along the Z axis). The magneto-resistive effect element 14 has a longitudinal direction along the X axis which is one of the directions perpendicular to the stacking direction. Furthermore, a pair of electrode layers 16 constituted by a conductive material such as Cu, Au, Ti, or Al which is a nonmagnetic metal are provided at the two ends in the longitudinal direction of the magneto-resistive effect element 14. By applying a voltage across the pair of electrode layers 16, a sensing current is supplied to the magneto-resistive effect element 14.

The thickness of the magneto-resistive effect element 14 is not particularly restricted and can be 20 to 100 nm, for example, nor are there any particular restrictions on the length in the longitudinal direction of the magneto-resistive effect element 14 or in a direction perpendicular to the longitudinal direction (along the Y axis), which can be 50 to 300 μm and 2 to 20 μm respectively, for example. Furthermore, when the length in the longitudinal direction of the magneto-resistive effect element 14 is X and the length in a direction perpendicular to the longitudinal direction (direction along the Y axis) is Y, X/Y, which is a value obtained by dividing X by Y, can be 25 to 150, for example.

A current path portion 22 is provided on the magneto-resistive effect element 14 via an insulation layer 18 which is constituted by an insulating material such as a ceramic insulator such as AlOx or a polymer insulator such as SiOx or polyimide, for example, so as to be separated in the stacking direction from the magneto-resistive effect element 14. The insulation layer 18 is preferably a stacked film of a plurality of insulation layers.

There are no particular restrictions on the current path portion 22, which may be constituted by a conductive material such as Cu, Au, Ti, or Al, which are nonmagnetic metals and can be formed by a vacuum thin film formation process such as sputtering or vapor deposition or by a wet process such as plating, for example. The current path portion 22 extends in a direction which is perpendicular to the longitudinal direction of the magneto-resistive effect element 14 when viewed from the stacking direction thereof. The thickness of the current path portion 22 can be 0.1 to 20 μm, for example. The length of the current path portion 22 in the Y axis direction is preferably greater than the length of the magneto-resistive effect element 14 in the Y axis direction so that the magnetic field generated by the current path portion 22 (described in detail subsequently) is applied mostly uniformly to the whole magneto-resistive effect element 14. Thus, if the magnetic field applied to the whole of the magneto-resistive effect element 14 is mostly uniform, the initialization of the magnetization of the magnetization-free layer (described subsequently) can be performed in a stable manner. Furthermore, the width of the current path portion 22 (its length in a direction along the X axis) can be 1 to 10 μm, for example.

Furthermore, according to this embodiment, the current path portion 22 also fulfills the role of generating an external magnetic field which is to be measured by being supplied with a current. That is, in this embodiment, a member which generates an external magnetic field to be measured is formed physically integrated with the magnetic sensor 50. The external magnetic field is measured by the magnetic sensor 50. In this embodiment, the magnetic sensor 50 comprises three current path portions 22 but the magnetic sensor 50 may also comprise one or two current path portions 22 or may comprise four or more thereof.

Figure 2:
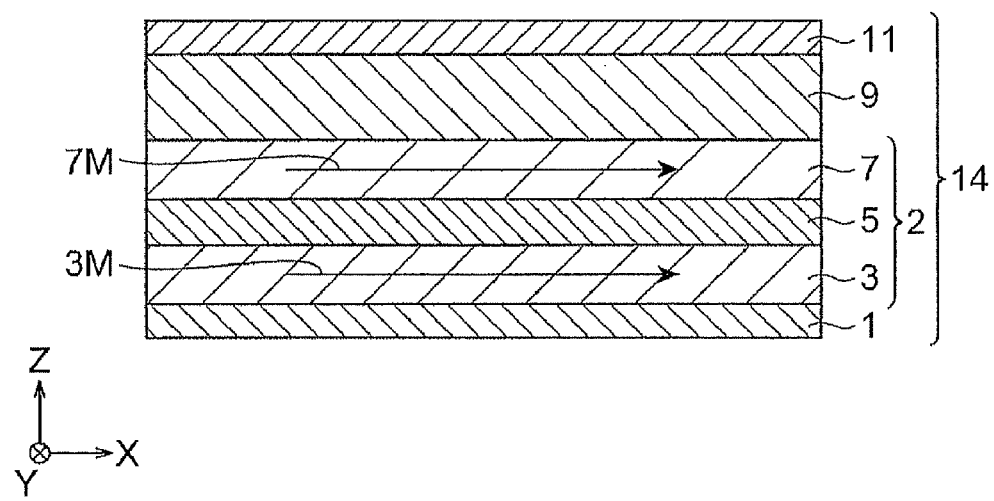
FIG. 2 is a detailed cross-sectional view of a magneto-resistive effect element.

FIG. 2 is a detailed cross-sectional view of the magneto-resistive effect element (XZ cross-section). As shown in FIG. 2, the magneto-resistive effect element 14 has a stacked body 2 obtained by stacking a magnetization-free layer 3, a nonmagnetic layer 5, and a magnetization fixed layer 7 in that order. That is, the magnetization-free layer 3, the nomnagnetic layer 5, and the magnetization fixed layer 7 are stacked such that the nonmagnetic layer 5 is positioned between the magnetization-free layer 3 and the magnetization fixed layer 7. Furthermore, the stacked body 2 is stacked on a underlayer 1 and an antiferromagnetic layer 9 and a cap layer 11 are stacked on the stacked body 2 in this order.

The magnetization-free layer 3 is constituted by a ferromagnetic material and is constituted by a two-layer film of CoFe on the order of 1 nm thick and NiFe on the order of 3 to 4 nm thick, or the like, for example. The magnetization direction 3M of the magnetization-free layer 3 is not fixed by an exchange coupling. Hence, when an external magnetic field is applied, the magnetization direction 3M of the magnetization-free layer 3 rotates easily in the application direction of the external magnetic field. In addition, in cases where the external magnetic field is not applied, the magnetization direction 3M of the magnetization-free layer 3 is weakly fixed in the X axis direction which is the longitudinal direction of the magneto-resistive effect element 14 as a result of the shape anisotropy of the magnetization-free layer 3.

The nomnagnetic layer 5 is constituted by a nonmagnetic conductive metal such as copper which is on the order of 1 to 3 nm thick.

The magnetization fixed layer 7 is constituted by a ferromagnetic substance of CoFe on the order of 1 to 5 nm thick. An antiferromagnetic layer 9 constituted by an antiferromagnetic substance consisting of IrMn, PtMn, NiMn, and RuRhMn or the like on the order of 5 to 15 nm thick is stacked on the magnetization fixed layer 7. The antiferromagnetic layer 9 and the magnetization fixed layer 7 are exchange-coupled and the magnetization direction 7M of the magnetization fixed layer 7 is substantially fixed in the positive direction of the X axis. The magnetization fixed layer 7 may have a three-layer structure in which a nonmagnetic intermediate layer of Ru or the like is sandwiched between a pair of ferromagnetic layers of CoFe or the like. In this case, if the film thickness of the nonmagnetic intermediate layer is suitably selected, the magnetization of the pair of ferromagnetic layers sandwiching the nonmagnetic intermediate layer is exchange-coupled in antiparallel and the magnetization fixed layer 7 has a so-called synthetic ferri-pinned structure. In this case, the magnetization direction of the magnetization fixed layer 7 is more strongly fixed.

The underlayer 1 is formed by a material such as Ta and is provided with the objective of improving the crystallinity of each layer stacked on the underlayer 1 of the magneto-resistive effect element 14. The cap layer 11 is formed by a material such as Ta and is provided with the objective of protecting each layer of the magneto-resistive effect element 14. The magneto-resistive effect element 14 may not comprise the underlayer 1 and/or the cap layer 11.

Applying a voltage across the pair of electrode layers 16 (see FIG. 1) causes a sensing current to flow in the magneto-resistive effect element 14 parallel to the film surface thereof. That is, the magneto-resistive effect element 14 is a current-in-plane (CIP) GMR (Giant Magneto-Resistive) element, A method of measuring the external magnetic field strength which uses the magnetic sensor according to this embodiment will be described next using FIGS. 3 to 6.

Figure 3:
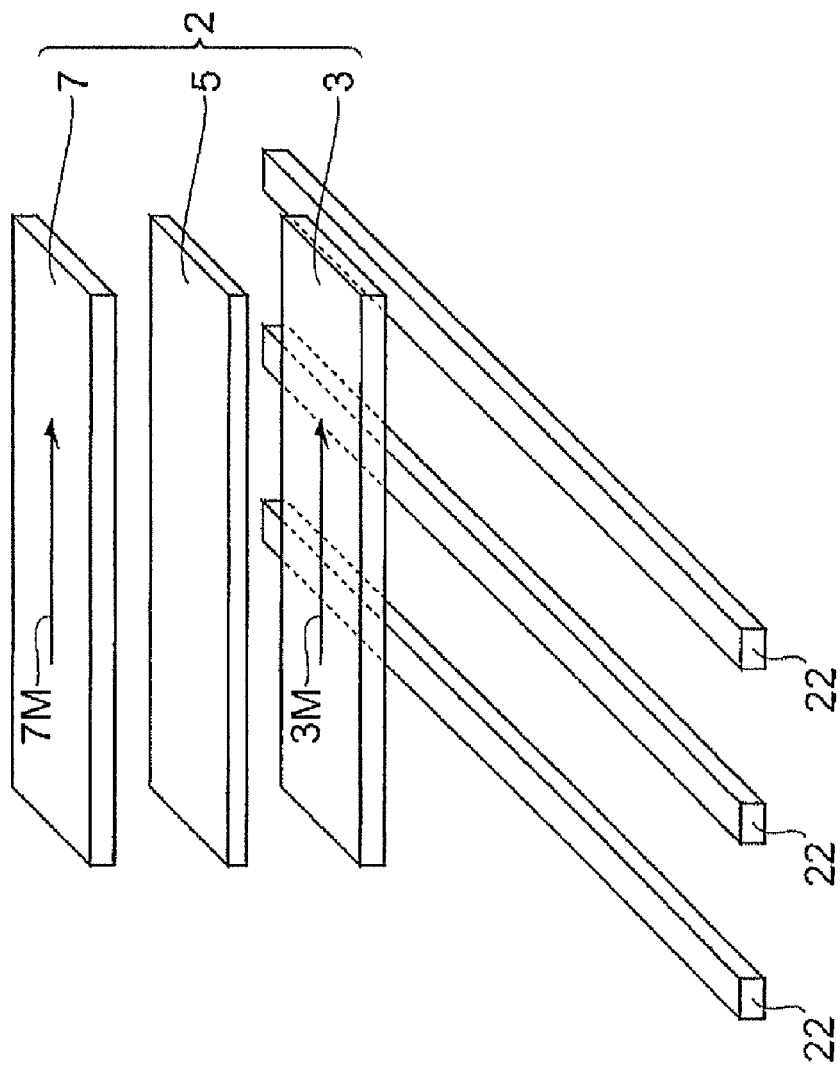
FIG. 3 is a schematic view of the positional relationships between a stacked body and a current path portion which the magneto-resistive effect element comprises.
Figure 4:
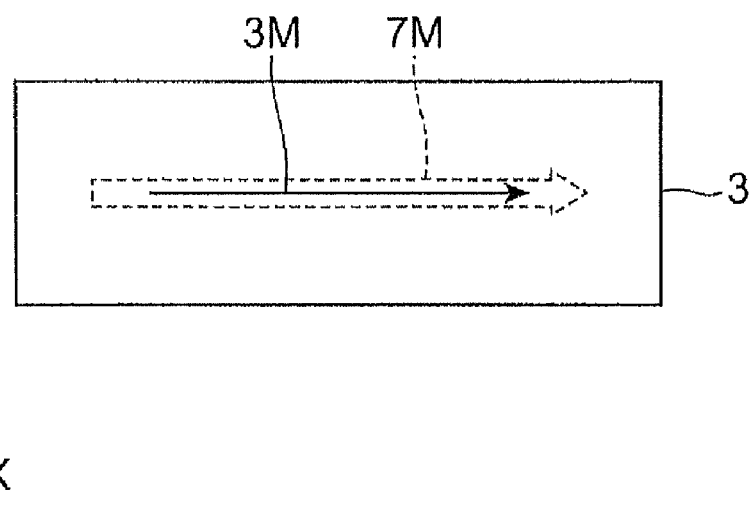
FIG. 4 is a view showing a magnetization-free layer from the stacking direction of the magneto-resistive effect element.
Figure 5A:
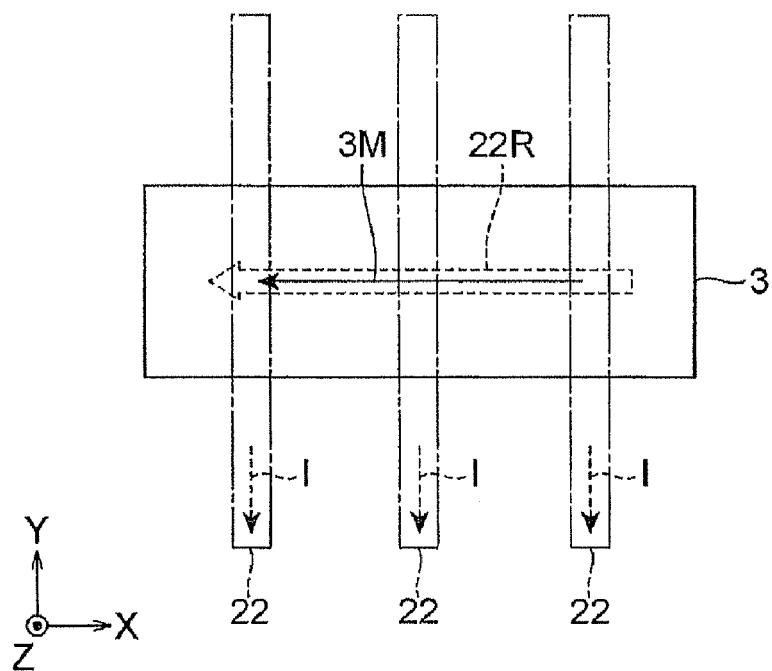
FIG. 5A is a view showing the magnetization-free layer from the stacking direction of the magneto-resistive effect element.
Figure 5B:
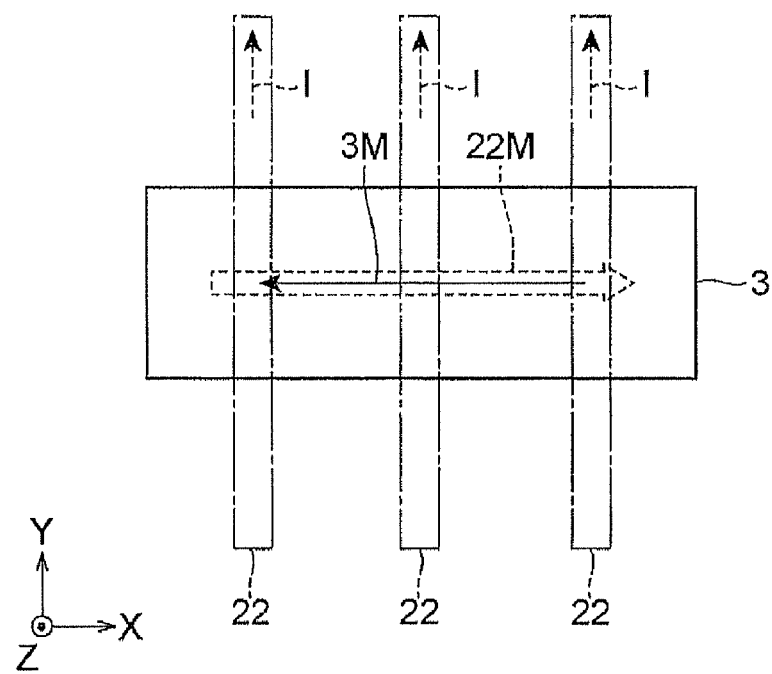
FIG. 5B is a view showing the magnetization-free layer from the stacking direction of the magneto-resistive effect element.

FIG. 3 is a schematic view of the positional relationships between the stacked body 2 and the current path layer 22 which the magneto-resistive effect element 14 (See FIG. 2) comprises. The magnetization-free layer 3, the nonmagnetic layer 5, and the magnetization fixed layer 7 constituting the stacked body 2 are originally stacked in that order (See FIG. 2) and FIG. 3 (and FIGS. 9 and 11 below) expediently shows each of these layers separately. A pair of electrode layers 16 and insulation layers 18 are not shown in FIG. 3. FIG. 4 is a view showing the magnetization-free layer 3 when viewed from the stacking direction of the magneto-resistive effect element 14 and shows the relationship between the magnetization direction 3M of the magnetization-free layer 3 and the magnetization direction 7M of the magnetization fixed layer 7. FIGS. 5A and 5B are views showing the magnetization-free layer 3 when viewed from the stacking direction of the magneto-resistive effect element 14 and shows the relationship between the magnetization-free layer 3 and the current path portion 22.

As shown in FIGS. 3 and 4, the magnetization direction 7M of the magnetization fixed layer 7 is fixed in the longitudinal direction of the magnetization-free layer 3 when viewed from the stacking direction of the magneto-resistive effect element 14. Furthermore, as shown in FIGS. 4, 5A and 5B, the current path portion 22 extends in a direction which is perpendicular to the longitudinal direction of the magnetization-free layer 3 when viewed from the stacking direction of the magneto-resistive effect element 14.

(Magnetic Field Application Step)

In cases where an external magnetic field is measured, before the external magnetic field is measured, a current I which flows in a negative direction along the Y axis is supplied to the current path portion 22 as shown in FIG. 5A and a magnetic field 22R which is generated by the current path portion 22 is applied to the magnetization-free layer 3 More specifically, in order to saturate the magnetization of the magnetization-free layer 3, the magnetic field 22R generated by the current path portion 22 is applied for a predetermined time to the magnetization-free layer 3 to saturate the magnetization-free layer 3 in one of the longitudinal directions thereof (in the negative direction along the X axis in this embodiment). The magnetization-free layer 3 and the current path portion 22 have a positional relationship such as the one described above and therefore the magnetic field 22R which is generated by the current path portion 22 extends in the longitudinal direction of the magnetization-free layer 3 when viewed from the stacking direction of the magneto-resistive effect element 14. The time during which the magnetic field 22R is applied to the magnetization-free layer 3 may be equal to or greater than the time required to saturate the magnetization of the magnetization-free layer 3.

(Magnetic Field Measurement Step)

The external magnetic field is subsequently measured. The measurement of the external magnetic field involves, as shown in FIG. 5B, supplying the current I flowing in a positive direction along the Y axis to the current path portion 22 and applying a magnetic field 22M generated by the current path portion 22 (the external magnetic field which is to be measured) to the magnetization-free layer 3. The magnetization-free layer 3 and the current path portion 22 have the positional relationship described earlier and therefore the external magnetic field which is to be measured is applied in the reverse direction from the direction in which the magnetization of the magnetization-free layer 3 is saturated, that is, in the other longitudinal direction of the magnetization-free layer 3 (in the positive direction along the X axis in this embodiment).

Because the magnetization direction 3M of the magnetization-free layer 3 changes due to the application of the magnetic field 22M, the relative angle between the magnetization direction 3M of the magnetization-free layer 3 and the magnetization direction 7M of the magnetization fixed layer 7 (see FIGS. 3 and 4) when viewed from the stacking direction of the magneto-resistive effect element 14 changes. For example, in cases where the magnetic field 22M is very strong and the magnetization of the magnetization-free layer 3 is saturated, the magnetization direction 3M of the magnetization-free layer 3 is oriented in a positive direction along the X axis which is the longitudinal direction of the magnetization-free layer 3, as shown in FIG. 5A. That is, the magnetization direction 3M of the magnetization-free layer 3 depends on the magnitude of the magnetic field 22M and changes within the magnetization-free layer 3 to rotate between the negative direction along the X axis to the positive direction along the X axis which are the longitudinal directions of the magnetization-free layer 3. Furthermore, due to the magneto-resistive effect, the resistance value of the magneto-resistive effect element 14 changes depending on the relative angle between the magnetization direction 3M and the magnetization direction 7M. The amount of variation in the magnetization direction 3M depends on the strength of the magnetic field 22M. Hence, if a voltage is applied across the pair of electrode layers 16 (see FIG. 1) so that a fixed sensing current is caused to flow in the magneto-resistive effect element 14 and the magnetic field 22M is applied to the magnetization-free layer 3, for example, the voltage across the pair of electrode layers 16 varies depending on the strength of the magnetic field 22M. Hence, if the voltage across the pair of electrode layers 16 is measured, the strength of the magnetic field 22M can be measured.

Figure 6:
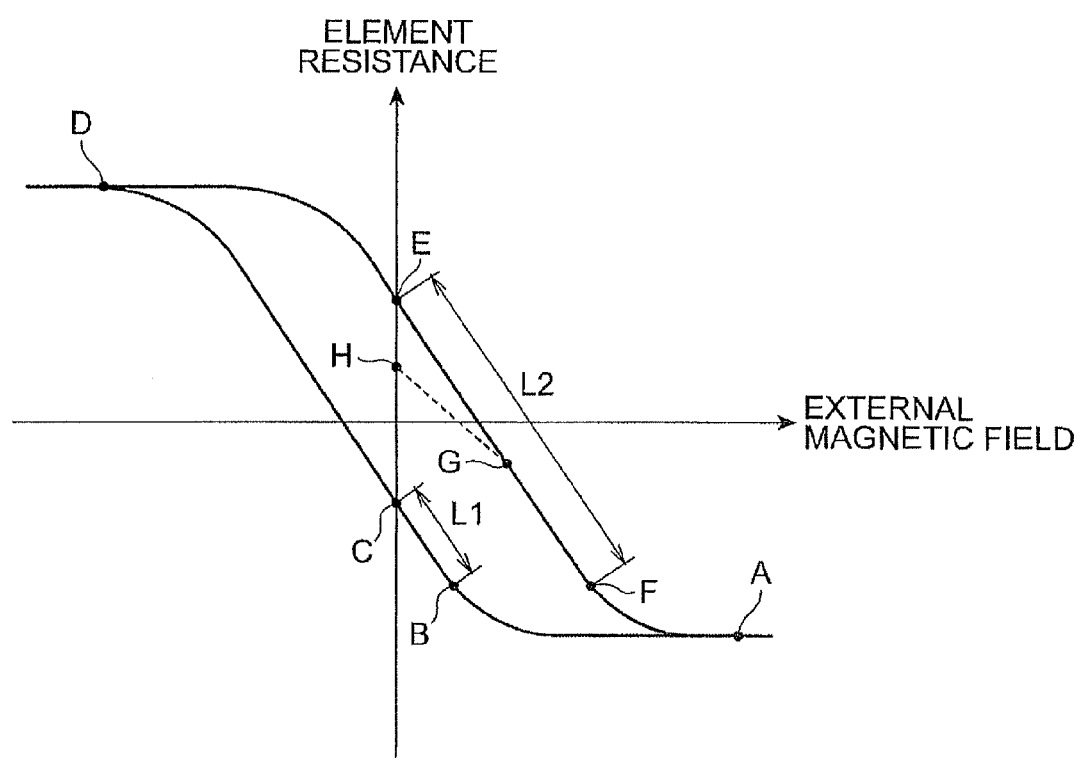
FIG. 6 is a view showing the relationship between a resistance value of the magneto-resistive effect element and an external magnetic field.

The effect of applying the magnetic field 22R to the magnetization-free layer 3 before measuring the external magnetic field as mentioned earlier will now be described with reference to FIG. 6. FIG. 6 is a view showing the relationship between the resistance value of the magneto-resistive effect element and the external magnetic field. In FIG. 6, the vertical axis represents the resistance value of the magneto-resistive effect element 14 and the horizontal axis represents the strength of the external magnetic field which is applied to the magnetization-free layer 3, where a case where the application of the external magnetic field in the positive direction of the X axis is shown as a positive direction.

As shown in FIG. 6, because the relative angle between the magnetization direction 3M of the magnetization-free layer 3 and the magnetization direction 7M of the magnetization fixed layer 7 changes when the external magnetic field is applied to the magnetization-free layer 3, the resistance value of the magneto-resistive effect element 14 changes. However, because the relationship between the resistance value of the magneto-resistive effect element 14 and the external magnetic field exhibits hysteresis, the relationship between the external magnetic field and the resistance value of the magneto-resistive effect element 14 is not necessarily limited to one-to-one correspondence. The existence of hysteresis causes errors in the measurement of the external magnetic field.

However, with the method for measuring the external magnetic field strength by means of the magnetic sensor 50 according to this embodiment as outlined above, the magnetic field 22R is applied so that the magnetization of the magnetization-free layer 3 is saturated prior to applying the external magnetic field 22M which is to be measured to the magnetization-free layer 3 (See FIG. 4). Hence, the resistance value of the magneto-resistive effect element 14 assumes a value E after reaching a value D in FIG. 6. Thereafter, when the magnetic field 22M which is to be measured (See FIGS. 5A and 5B) is applied, the resistance value of the magneto-resistive effect element 14 changes so as to pass along the path E-G-F (the path of a linear region L2).

That is, the magnetized state of the magnetization-free layer 3 after applying the magnetic field 22R so that the magnetization of the magnetization-free layer 3 is saturated is fixed irrespective of the magnetized state of the magnetization-free layer 3 prior to applying the magnetic field 22R. It can be seen that the magnetization of the magnetization-free layer 3 is initialized prior to measurement of the external magnetic field 22M. The effect of initializing the magnetization is one-to-one correspondence between the strength of the magnetic field 22M and the resistance value of the magneto-resistive effect element 14 and therefore the strength of the magnetic field 22M can be accurately measured.

When the external magnetic field 22M is measured a plurality of times, the initialization of the magnetization of the magnetization-free layer 3 may be carried out each time prior to measuring the external magnetic field 22M or may be performed before the external magnetic field 22M is measured the next time after the external magnetic field 22M has been measured a fixed number of times. The magnetization can also be initialized after a fixed time has elapsed. The resistance value of the magneto-resistive effect element 14 after measuring the external magnetic field 22M of the strength G in FIG. 6 is a value H in FIG. 6, for example. When the external magnetic field is re-measured after this state is assumed, the resistance value of the magneto-resistive effect element 14 differs from the value on the path of the linear region L2. The magnetization of the magnetization-free layer 3 is therefore preferably initialized each time prior to measuring the external magnetic field 22M.

Furthermore, according to this embodiment, the direction of the magnetic field 22R which is applied when initializing the magnetization of the magnetization-free layer 3 and the direction of the external magnetic field 22M which is to be measured are opposite to one another. Hence, in the relationship between the resistance value of the magneto-resistive effect element 14 in FIG. 6 and the external magnetic field, the linear part of the linear region L2 is long and the measurement range when measuring the external magnetic field 22M is broad. In contrast, supposing that the magnetic field 22R which is applied when initializing the magnetization of the magnetization-free layer 3 is applied in the same direction as the direction of the external magnetic field 22M which is to be measured, the resistance value of the magneto-resistive effect element 14 then reaches a value C after attaining a value A. When the external magnetic field 22M which is to be measured is applied after this state is assumed, the resistance value of the magneto-resistive effect element 14 changes so as to pass along the path C-B (the path of a linear region L1). The linear region L1 then has a short linear part and therefore the measurement range when measuring the external magnetic field 22M narrows.

According to the magnetic field measurement method, the gain when measuring the external magnetic field 22M (the tilt of the linear region L2 in FIG. 6) can be made large. That is, the magnetization direction 7M of the magnetization fixed layer 7 is fixed in a direction which follows the longitudinal direction in the magnetization-free layer 3 when viewed from the stacking direction of the magneto-resistive effect element 14. Hence, when measuring the external magnetic field 22M, the orientation of the magnetization direction 3M of the magnetization-free layer 3 changes within the magnetization-free layer 3 to rotate between one longitudinal direction of the magnetization-free layer 3 and another longitudinal direction. Furthermore, the magnetization direction 3M is extremely easy to orient in both the longitudinal directions of the magnetization-free layer 3 due to the shape anisotropy of the magnetization-free layer 3. As a result, the relationship between the resistance value of the magneto-resistive effect element 14 in FIG. 6 and the external magnetic field exhibits a large amount of hysteresis. Hence, the gain when measuring the external magnetic field 22M is large.

In addition, according to this embodiment, the magnetic field 22R generated by the current path portion 22 extends within the magnetization-free layer 3 in the longitudinal direction of the magnetization-free layer 3 when viewed from the stacking direction. The magnetization of the magnetization-free layer 3 can thus be easily saturated by the current path portion 22.

According to this embodiment, the magnetization direction 7M of the magnetization fixed layer 7 is fixed in the longitudinal direction of the magnetization-free layer 3 when viewed from the stacking direction. The hysteresis of the magnetization-free layer 3 is accordingly particularly large. As a result, the gain when measuring the external magnetic field 22M is particularly large.

The magnetic sensor 50 according to this embodiment measures the magnetic field 22M generated by the current path portion 22. However, if information on the relative positional relationship between the magnetic sensor 50 and the current path portion 22 is already known in addition to the strength of the magnetic field 22M, the value of the current flowing in the current path portion 22 can be measured. That is, the magnetic sensor 50 according to this embodiment can also be used as the current sensor.

The present invention is not limited to the above embodiment and a variety of modifications are possible.

Figure 7:
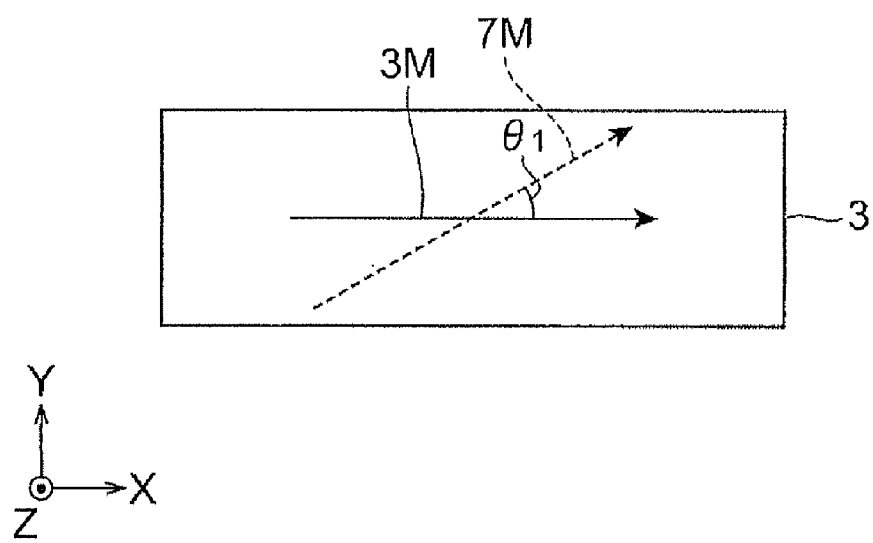
FIG. 7 is a view showing the magnetization-free layer from the stacking direction of the magneto-resistive effect element.

For example, as shown in FIG. 7, the magnetization direction 7M of the magnetization fixed layer 7 may also form an angle $\theta_1$ to the longitudinal direction of the magnetization-free layer 3 when viewed from the stacking direction of the magneto-resistive effect element 14. In this case, because the degree of hysteresis of the magnetization-free layer 3 can be varied by changing the angle $\theta_1$, there is the advantage that the gain can be adjusted proactively. The angle $\theta_1$ is preferably equal to or less than 45 degrees. This is because the hysteresis of the magnetization-free layer 3 is sufficiently large and the gain when measuring the external magnetic field 22M is adequately large.

Figure 8A:
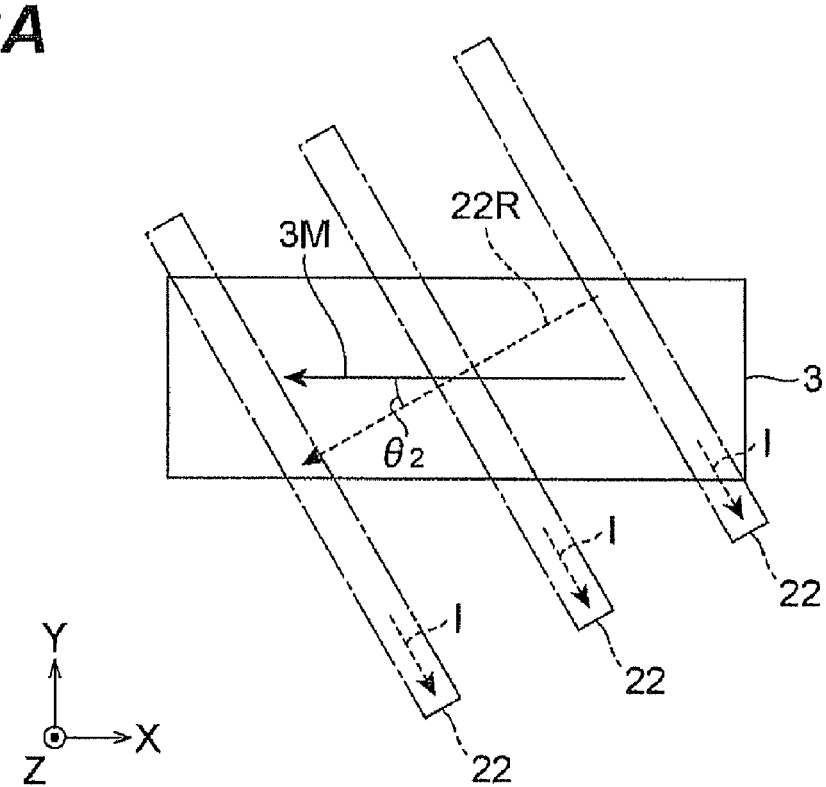
FIG. 8A is a view showing the magnetization-free layer from the stacking direction of the magneto-resistive effect element.
Figure 8B:
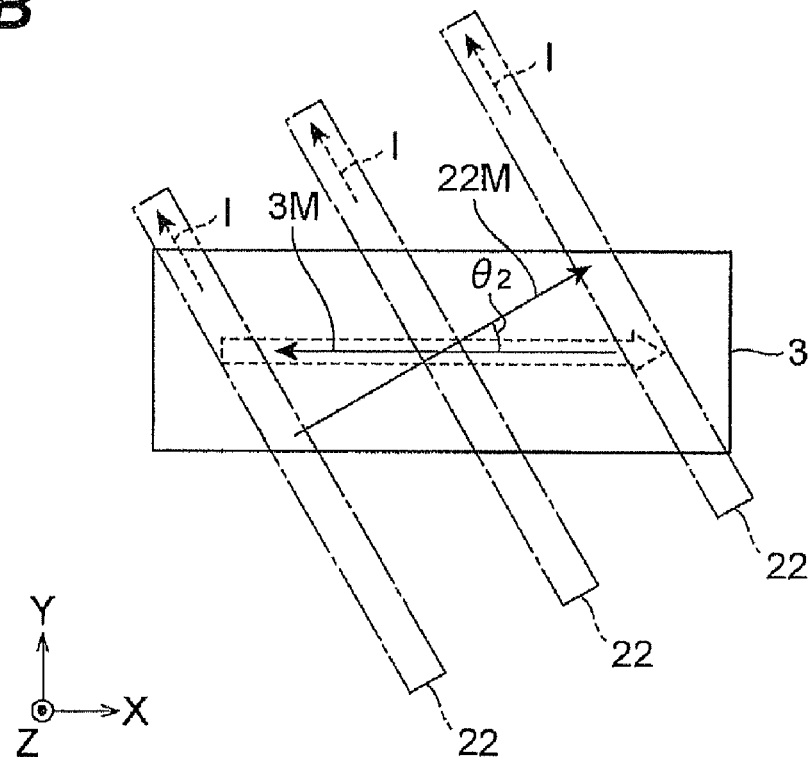
FIG. 8B is a view showing the magnetization-free layer from the stacking direction of the magneto-resistive effect element.

Furthermore, as shown in FIGS. 8A and 8B, the current path portion 22 need not be perpendicular to the longitudinal direction of the magnetization-free layer 3 when viewed from the stacking direction of the magneto-resistive effect element 14. In this case, the magnetic fields 22R and 22M generated by the current path portion 22 form an angle $\theta_2$ to the longitudinal direction of the magnetization-free layer. In this case, because the relative angle of the magnetization direction 3M of the magnetization-free layer 3 with respect to the magnetic fields 22R and 22M generated by the current path portion 22 can be varied by changing the angle $\theta_2$, there is the advantage that the gain can be varied proactively. Angle $\theta_2$ is preferably equal to or less than 45 degrees. This is because the relative angle between the magnetization direction 3M of the magnetization-free layer 3 and the magnetization direction 7M of the magnetization fixed layer 7 is varied within a sufficiently wide range and the gain is therefore easily adjusted when measuring the external magnetic field 22M which is to be measured.

Figure 9:
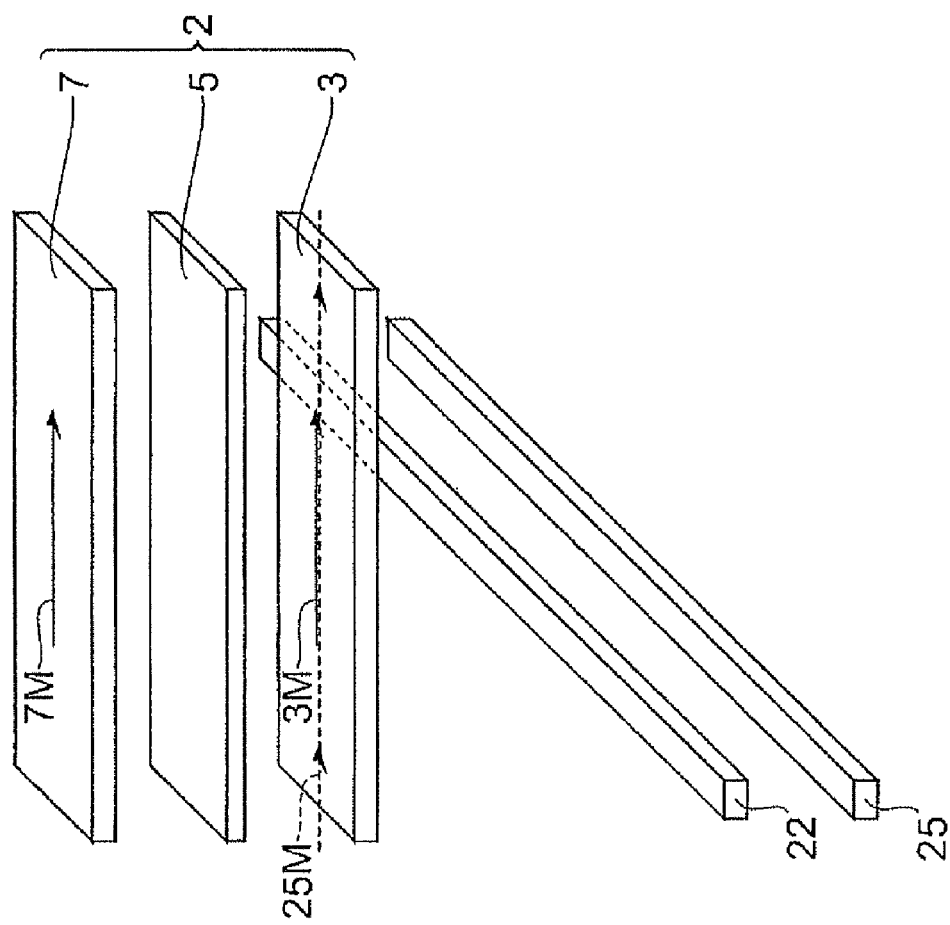
FIG. 9 is a schematic view of the positional relationships between the stacked body and the current path portion which the magneto-resistive effect element comprises.

Furthermore, as shown in FIG. 9, a magnetic field generation portion 25 which generates an external magnetic field which is to be measured may also be provided separately from the current path portion 22. The magnetic field generation portion 25 is a metal layer which extends in a direction which is perpendicular to the longitudinal direction of the magneto-resistive effect element 14, for example. A current flows in the magnetic field generation portion 25 and causes same to generate an external magnetic field 25M which is to be measured. The magnetic field generation portion 25 may also be formed so as to be physically integrated with the magnetic sensor 50 but may also be physically separate from the magnetic sensor 50. Furthermore, the magnetic field generation portion 25 is not limited to a metal layer extending in a fixed direction. An aspect in which the magnetic field generated is applied in the reverse direction from the direction in which the magnetization of the magnetization-free layer 3 is saturated is also possible. The magnetic field generation portion 25 may also be a coil or the like, for example.

Figure 10:
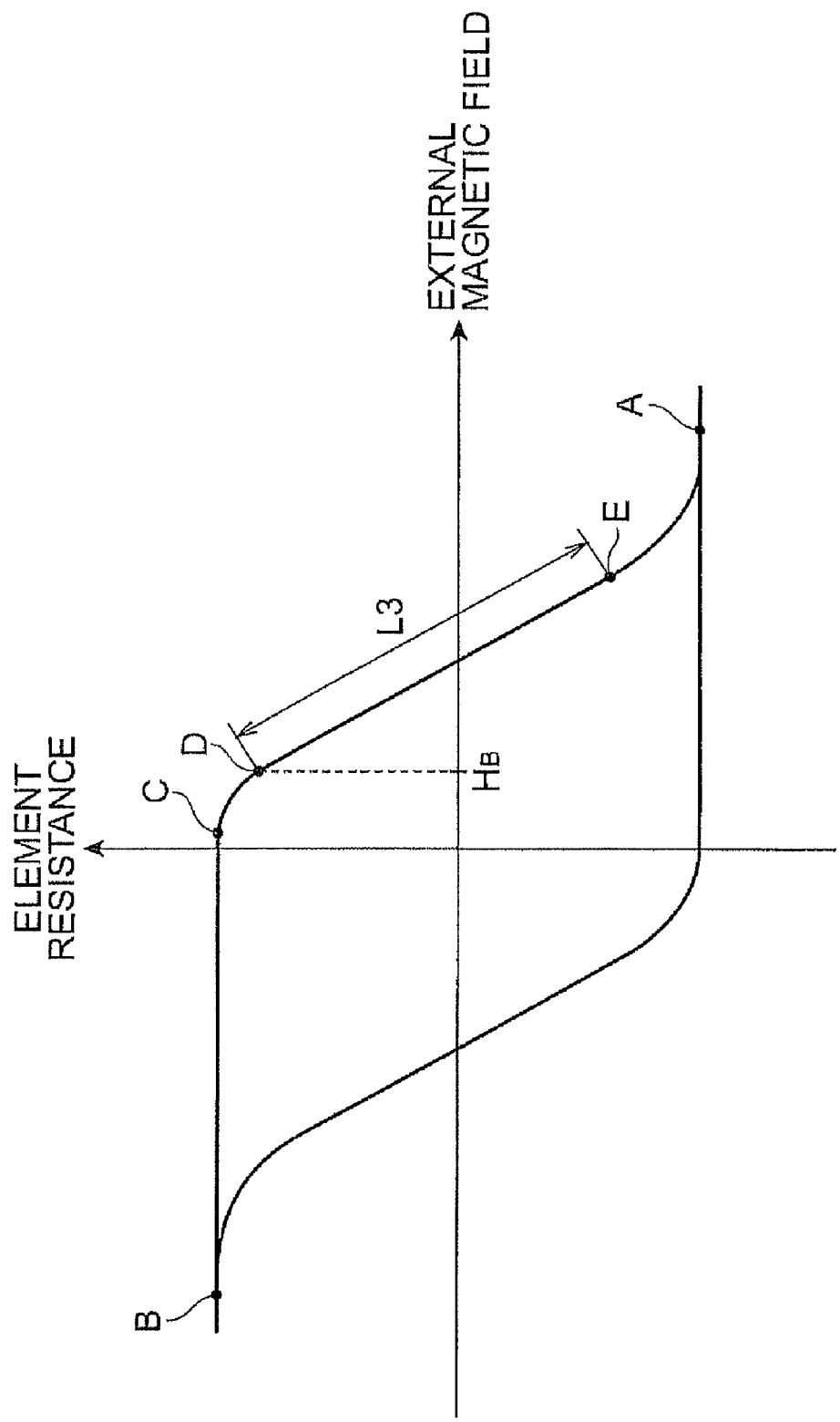
FIG. 10 is a schematic view of the positional relationships between the stacked body and the current path portion which the magneto-resistive effect element comprises.

Furthermore, in the magnetic field measuring step, an external magnetic field which is to be measured may also be applied by the current path portion 22 to the magnetization-free layer 3 in the other direction in the longitudinal direction while applying a bias magnetic field of a predetermined strength to the magnetization-free layer 3 in the other direction in the longitudinal direction (a direction opposite the application magnetic field when the magnetization is initialized). This is particularly effective in cases where the relationship between the element resistance of the magneto-resistive effect element 14 and the external magnetic field exhibits hysteresis as shown in FIG. 10. That is, the resistance value of the magneto-resistive effect element 14 passes through value B and assumes value C in order to initialize the magnetization of the magnetization-free layer 3. In cases where the value C is separate from the linear region L3 from D to E of the hysteresis, a bias magnetic field $H_B$ is preferably applied by the current path portion 22. When an external magnetic field which is to be measured is applied to the magnetization-free layer 3 in this state, the resistance value of the magneto-resistive effect element 14 changes to a value in the linear region L3 from D to E. It is thus possible to measure the external magnetic field by utilizing the linear region L3 with a particularly high linearity in the relationship of the resistance value of the magneto-resistive effect element 14 with the external magnetic field. As a result, errors when measuring the external magnetic field can be further reduced.

An aspect of the current path portion 22 as magnetic field application means is not limited to a metal layer which extends in a fixed direction. A coil 22a which is wound around the X axis as shown in FIG. 11 can also be used as magnetic field application means. Furthermore, in the above embodiment, the current path portion 22 which is magnetic field application means is a layer-like member which is formed by a vacuum thin-film formation process such as sputtering or vapor deposition or a wet process such as plating but the current path portion may also be a linear member such as copper wire.

In addition, the magneto-resistive effect element 14 is a CIP-type GMR element in the above embodiment but may also be a CPP (Current Perpendicular in Plane)-type GMR element or a TMR (Tunnel Magneto-Resistive) element. In cases where the magneto-resistive effect element 14 is a CPP-type GMR element, the pair of electrode layers 16 (see FIG. 1) are electrically connected to both end faces of the magneto-resistive effect element 14 in the stacking direction. Further, when the magneto-resistive effect element 14 is a TMR element, the nonmagnetic layer 5 (see FIG. 2) is also constituted by a nonmagnetic insulation material such as $Al_2O_3$ or MgO with a thickness on the order of 1 to 2 nm instead of a nonmagnetic metal such as copper.

Furthermore, although the magnetic field generated by the current is measured by the magnetic sensor 50 in this embodiment, the magnetic sensor 50 may also be used in an application for sensing the strength of the magnetic field generated by a permanent magnet or for sensing the distance from the permanent magnet by the strength of the magnetic field, for example.

What is claimed is:

1. A magnetic field measurement method, comprising:
   a step of preparing a magnetic sensor which comprises:
      a magneto-resistive effect element which has a stacked body obtained by stacking, in a stacking direction,
         a magnetization-free layer,
         a nonmagnetic layer and
         a magnetization fixed layer so that the nonmagnetic layer is positioned between the magnetization-free layer and the magnetization fixed layer, the magnetization-free layer having a longitudinal direction that is perpendicular to the stacking direction; and
      magnetic field application means for generating a magnetic field when being supplied with a current,
      wherein
      the magnetization fixed layer has a magnetization direction that is fixed in a direction which forms an angle equal to or less than 45 degrees to the longitudinal direction of the magnetization-free layer when viewed from the stacking direction, and
      the magnetic field generated by the magnetic field application means forms within the magnetization-free layer an angle equal to or less than 45 degrees to the longitudinal direction of the magnetization-free layer when viewed from the stacking direction;
   a magnetic field application step of applying a magnetic field in a first direction for a predetermined time to the magnetization-free layer by the magnetic field application means so that magnetization of the magnetization-free layer is saturated, and magnetizing the magnetization-free layer in the first direction in the longitudinal direction thereof;
   a magnetic field measurement step of measuring a strength of an external magnetic field by applying the external magnetic field to the magnetization-free layer in a second direction in the longitudinal direction thereof, after an end of the magnetic field application step, the first direction and the second direction being opposite to each other, wherein
   a characteristic of a resistance value of the magneto-resistive effect element versus the external magnetic field has a region where the resistance value of the magneto-resistive effect element is proportional to the external magnetic field, and
   the magnetic field application step is performed to cause the magnetization of the magnetization-free layer to be saturated out of said region.

2. The magnetic field measurement method according to claim 1, wherein the magnetic field application means is a current path portion which extends in a direction which forms an angle equal to or less than 45 degrees to a direction perpendicular to the longitudinal direction of the magnetization-free layer when viewed from the stacking direction.

3. The magnetic field measurement method according to claim 1, wherein the magnetic field generated by the magnetic field application means is oriented within the magnetization-free layer in the longitudinal direction of the magnetization-free layer when viewed from the stacking direction.

4. The magnetic field measurement method according to claim 1, wherein the magnetization direction of the magnetization fixed layer is fixed in the longitudinal direction of the magnetization-free layer when viewed from the stacking direction.

5. The magnetic field measurement method according to claim 1,
   wherein, in the magnetic field measurement step, the external magnetic field which is to be measured is applied to the magnetization-free layer in the second direction in the longitudinal direction thereof by the magnetic field application means while applying a bias magnetic field of a predetermined strength to the magnetization-free layer in the other direction in the longitudinal direction thereof.

6. The magnetic field measurement method according to claim 1,
wherein the magnetic field measurement step is performed in the region where the resistance value of the magneto-resistive effect element is proportional to the external magnetic field.

7. A magnetic sensor, comprising:
a magneto-resistive effect element which has a stacked body obtained by stacking, in a stacking direction,
a magnetization-free layer,
a nonmagnetic layer and
a magnetization fixed layer so that the nonmagnetic layer is positioned between the magnetization-free layer and the magnetization fixed layer, the magnetization-free layer having a longitudinal direction that is perpendicular to the stacking direction; and
magnetic field application means for generating a magnetic field when being supplied with a current,
wherein
the magnetization fixed layer has a magnetization direction that is fixed in a direction which forms an angle equal to or less than 45 degrees to the longitudinal direction of the magnetization-free layer when viewed from the stacking direction,
the magnetic field generated by the magnetic field application means forms within the magnetization-free layer an angle equal to or less than 45 degrees to the longitudinal direction of the magnetization-free layer when viewed from the stacking direction,
the magnetic field application means applies a magnetic field for a predetermined time to the magnetization-free layer so that the magnetization of the magnetization-free layer is saturated, and magnetizing the magnetization-free layer in a first direction in the longitudinal direction thereof;
after an end of the magnetic field application by the magnetic field application means, a strength of an external magnetic field is measured by applying the external magnetic field to the magnetization-free layer in a second direction in the longitudinal direction thereof, the first direction and the second direction being opposite to each other, wherein
a characteristic of a resistance value of the magneto-resistive effect element versus the external magnetic field has a region where the resistance value of the magneto-resistive effect element is proportional to the external magnetic field, and
the magnetic field application step is performed to cause the magnetization of the magnetization-free layer to be saturated out of said region.

8. The magnetic sensor according to claim 7,
wherein the magnetic field measurement is performed in the region where the resistance value of the magneto-resistive effect element is proportional to the external magnetic field.

* * * * *